(12) United States Patent
Livings et al.

(10) Patent No.: US 8,025,730 B2
(45) Date of Patent: Sep. 27, 2011

(54) APPARATUS AND METHOD FOR COATING INTERNAL SURFACES OF A TURBINE ENGINE COMPONENT

(75) Inventors: Mark A. Livings, East Windsor, CT (US); Walter E. Olson, Buckeye, AZ (US)

(73) Assignee: United Technologies Corporation, Hartford, CT (US)

( * ) Notice: Subject to any disclaimer, the term of this patent is extended or adjusted under 35 U.S.C. 154(b) by 1080 days.

(21) Appl. No.: 11/825,782

(22) Filed: Jul. 9, 2007

(65) Prior Publication Data

US 2009/0017205 A1    Jan. 15, 2009

(51) Int. Cl.
*C23C 16/52* (2006.01)
(52) U.S. Cl. ........ 118/715; 118/719; 118/728; 427/237; 427/250
(58) Field of Classification Search .................. 118/715, 118/719, 728; 427/237, 250
See application file for complete search history.

(56) References Cited

U.S. PATENT DOCUMENTS

| 5,071,678 | A | * | 12/1991 | Grybowski et al. ........... 427/253 |
| 5,087,477 | A | * | 2/1992 | Giggins et al. ................ 427/585 |
| 5,928,725 | A |   | 7/1999 | Howard et al. |
| 6,039,810 | A | * | 3/2000 | Mantkowski et al. ........ 118/715 |
| 6,616,969 | B2 | * | 9/2003 | Pfaendtner et al. ........... 427/237 |
| 2001/0055650 | A1 |   | 12/2001 | Pfaendtner et al. |
| 2007/0116874 | A1 | * | 5/2007 | Olson ........................ 427/248.1 |

FOREIGN PATENT DOCUMENTS

EP      1788109 A1    5/2007

* cited by examiner

*Primary Examiner* — Ram Kackar
*Assistant Examiner* — Satish Chandra
(74) *Attorney, Agent, or Firm* — Bachman & LaPointe, P.C.

(57) ABSTRACT

A coating apparatus for coating interior surfaces of internal passages of a workpiece, such as a turbine engine component is provided. The coating apparatus comprises a vessel defining an internal space, a plate dividing the internal space into a first chamber and a second chamber, a divider supporting the plate, and the plate having at least one cut-out for receiving a portion of the workpiece having the internal passages to be coated.

11 Claims, 3 Drawing Sheets

APPARATUS AND METHOD FOR COATING INTERNAL SURFACES OF A TURBINE ENGINE COMPONENT

BACKGROUND

The present disclosure relates to an apparatus for coating internal surfaces of internal passages of a workpiece, such as a turbine engine component, and to a method for forming a coating on internal surfaces of the workpiece.

BACKGROUND ART

High pressure turbine blades, vanes, and seals operating in modern gas turbine engines are life limited by both thermal fatigue cracking on the airfoil and coating defeat due to oxidation from high operating temperatures. The need for good oxidation resistance on the airfoil necessitates the application of a suitable oxidation resistance coating such as a MCrAlY metallic overlay coating with increased oxidation resistance and/or a thermal barrier coating system for temperature reduction. Internal oxidation and corrosion have been experienced in turbine engine components such as high pressure turbine blades or vanes. Thus, there is a need to coat the internal surfaces of these turbine engine components for protection from the operating environment.

Vapor phase aluminizing processes in use today do not allow the coating of internal surfaces without applying a standard thickness coating on the external surface of the turbine engine component at the same time. The presence of an external aluminide coating with either a MCrAlY overlay or a thermal barrier coating on top is not desirable and may reduce the thermal fatigue resistance of the turbine engine component.

As noted above, engineering requirements for turbine engine components require an internal coating, such as an aluminide coating, for oxidation/corrosion protection. The presence of a coating, such as an aluminide coating, on an external surface of the turbine component, creates a debit in fatigue life. The better coating process is one which coats the internal surfaces of the turbine component while minimizing the deposition of a coating on the external surface to a thickness of less than 0.001 inches.

Current aluminizing process technology is not capable of coating a turbine engine component, such as a turbine blade, to meet these requirements because of the design of the coating apparatus and the fact that it is made out of a nickel alloy which becomes aluminide coated during the coating cycle. As a result, the coating apparatus acts as a reservoir of aluminum which can coat the external surfaces during subsequent aluminizing cycles.

Thus, there is a need for a coating apparatus which avoids this problem.

SUMMARY

In accordance with the present disclosure, there is provided a coating apparatus for coating internal passages of a workpiece such as a turbine engine component. The coating apparatus broadly comprises a vessel defining an internal space, a first plate dividing the internal space into a first chamber and a second chamber, a divider supporting the plate and dividing the first chamber into two compartments, and the plate having at least one cut-out for receiving a portion of a workpiece having the internal passages to be coated.

Further, there is provided a method for coating internal surfaces of a workpiece, such as turbine engine component. The method broadly comprises the steps of providing a vessel having a first chamber, divided into first and second compartments by a divider, and a second chamber, placing at least one workpiece with an internal surface to be coated in the second chamber, placing a generator for creating a coating gas in the first compartment of the first chamber, flowing the coating gas into an internal passageway of the at least one workpiece so that a coating is deposited on the internal surfaces, and creating a flow of an inert gas over exterior surfaces of the at least one workpiece to reduce coating material deposition on the exterior surfaces, which flow creating step comprising feeding the inert gas into the second chamber and causing the inert gas to flow into the second compartment of the first chamber.

Further, there is provided a coating apparatus for coating internal surfaces of a turbine engine component. The coating apparatus broadly comprises a vessel defining an internal space, a first plate for dividing the internal space into a first chamber and a second chamber, means for generating a coating gas in the first chamber, a divider separating the first chamber into first and second compartments, means for flowing the coating gas from the generating means into at least one internal passageway in the turbine engine component, and means for creating a flow of inert gas over exterior surfaces of the turbine engine component, which inert gas flow creating means comprising means for introducing the inert gas into the second chamber and means in the plate for allowing the inert gas to flow from the second chamber into the first chamber.

Other details of the apparatus and method for coating internal surfaces of a turbine engine component, as well as other objects and advantages attendant thereto, are set forth in the following detailed description and the accompanying drawings, wherein like reference numerals depict like elements.

DETAILED DESCRIPTION OF THE PREFERRED EMBODIMENT(S)

An apparatus to coat surfaces of internal passageways of a workpiece such as a turbine component, e.g. a turbine blade or vane, with minimal or no deposition on external surfaces of the workpiece is provided.

Figure 1:
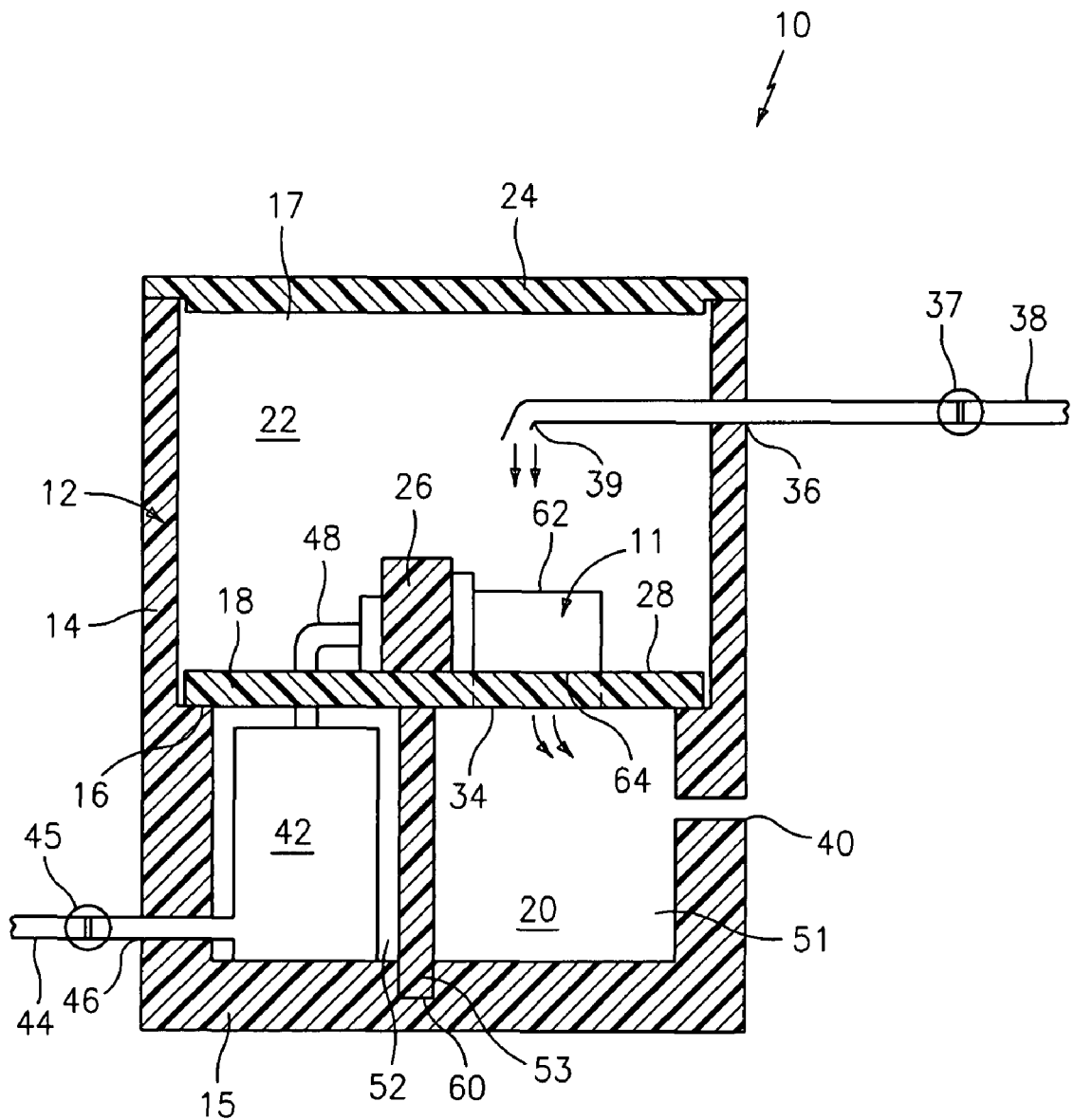
FIG. 1 is a sectional view of a coating apparatus in accordance with the present invention.
Figure 3:
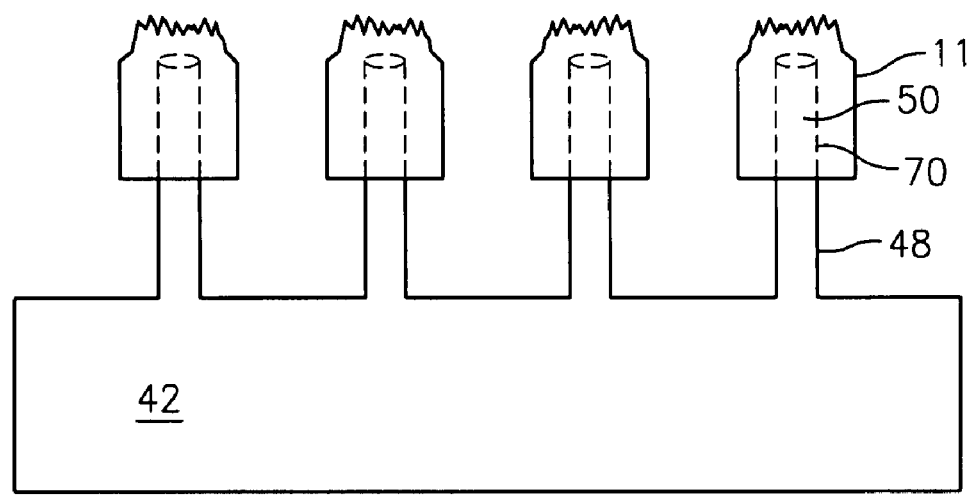
FIG. 3 is a schematic representation of the mechanism for supplying the coating gas to surfaces of internal passageways of a plurality of workpieces.
Figure 4:
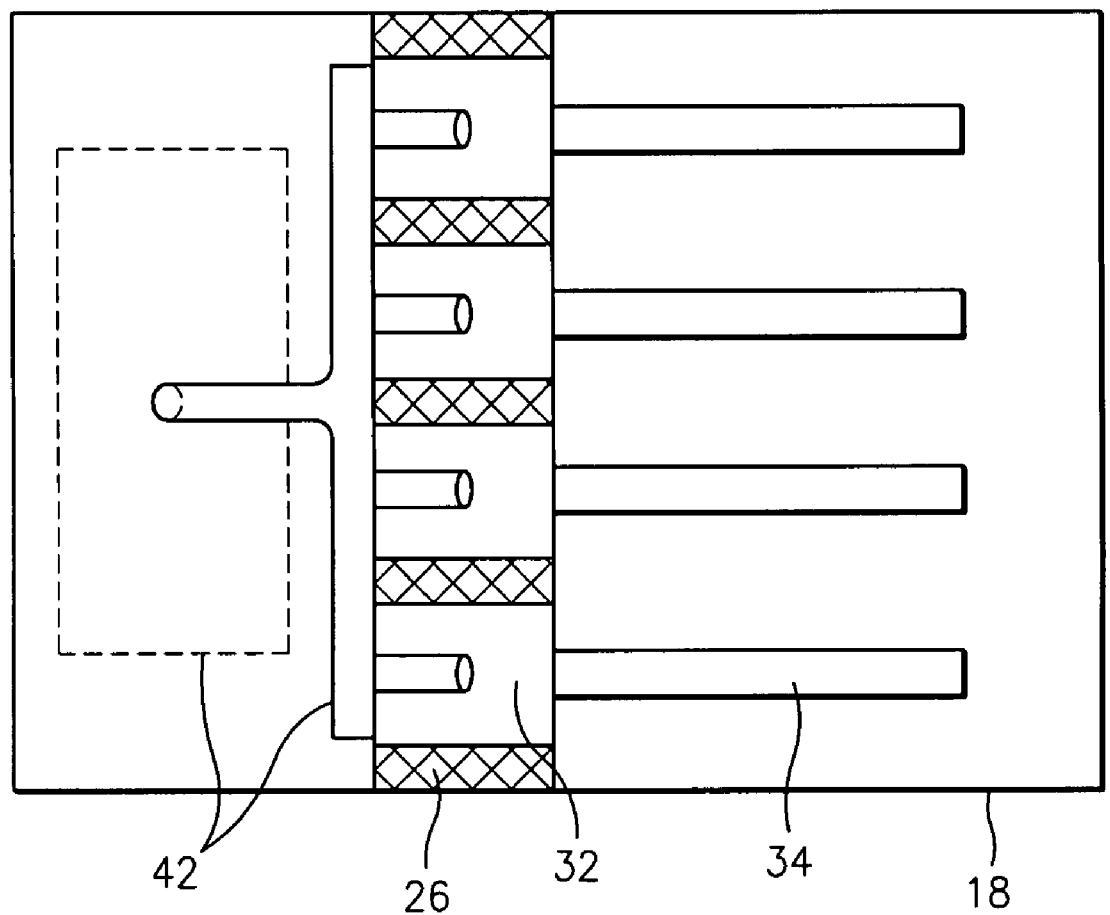
FIG. 4 is a top view of the support plate used in the coating apparatus of FIG. 1.

Referring now to FIGS. 1, 3 and 4 of the drawings, there is shown an apparatus 10 for coating surfaces of internal passageways 50 of one or more workpieces 11, such as one or more turbine engine component(s) having internal cooling passageways. The apparatus 10 includes a coating vessel 12 made of a material essentially inert for the purposes of this process, which does not become aluminized during the coating process. One suitable material from which the coating vessel 12 can be formed is graphite. The use of such a material is desirable because it prevents the coating vessel 12 itself from becoming a source of coating material and coating external surfaces of the turbine engine component during internal coating operations.

The coating vessel 12 may have a plurality of side walls 14, i.e. four side walls, and an end wall 15 defining an internal space. The side walls 14 form an open end 17. Each of the side walls 14 is provided with a shoulder portion 16, which preferably extends about the internal periphery of the vessel 12. A plate 18 is placed onto the shoulder portion 16 to divide the interior of the coating vessel 12 into a first chamber 20 and a second chamber 22. Typically, the first chamber 20 is a lower chamber and the second chamber 22 is an upper chamber. The plate 18 may be secured to the shoulder portion 16 if desired. Any suitable means known in the art may be used to removably secure the plate 18 to the shoulder portion 16. By having a plate 18 which is removably secured to the shoulder portion 16, one can use different plates for different types of workpieces. A divider 53 separates first chamber 20 into first and second compartments 51 and 52. The divider 53 locates in slot 60 in end wall 15 and slots (not shown) in two opposing side walls 14.

The coating vessel 12 also has a cover 24 which closes the open end 17 formed by the side walls 14. The cover 24 is typically formed of the same material as the rest of the coating vessel 12. The cover 24 may be secured to the side walls 14 using any suitable means known in the art.

Figure 2:
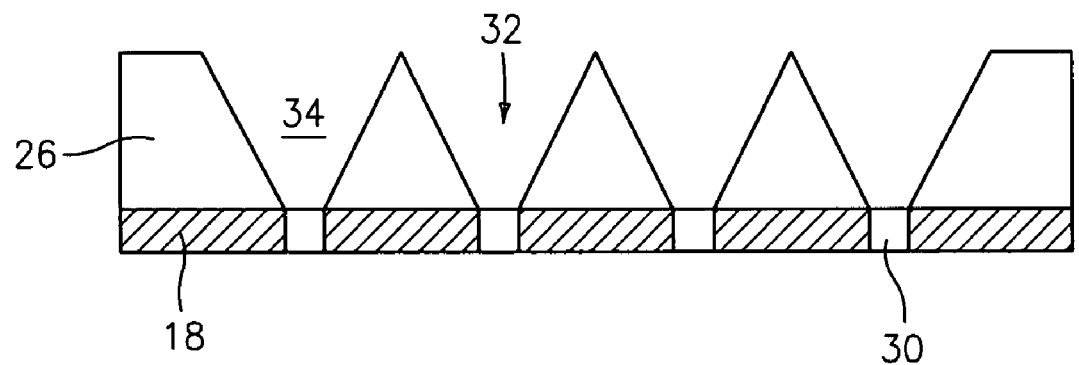
FIG. 2 illustrates a sectional view of a support plate used in the coating apparatus of FIG. 1.

The plate 18 preferably includes a locator support 26 which is positioned at an angle to a surface 28 of the plate 18. As shown in FIG. 2, the plate 18 has one or more cut-outs 30. Each cut-out 30 is shaped to receive a portion of a respective workpiece 11. Preferably, each cut-out 30 is shaped to conform to a specific workpiece feature such as a trailing edge.

The locator support 26 has one or more grooves 32. Each groove 32 receives a root portion of a respective workpiece 11. Preferably, as shown in FIG. 2, each groove 32 is V-shaped so as to form a plurality of slots 34 with a portion of a side wall 14.

The locator support 26 may be integrally formed with the plate 18. Alternatively, the locator support 26 may be a separate item which is joined to the plate 18 using any suitable means known in the art. The locator support 26 and the plate 18 are preferably formed from a material, such as graphite, to which the coating material does not adhere.

The second chamber 22 has a first opening 36 to receive a feed line 38 from a source (not shown) of an inert gas, such as argon. The inert gas is fed into the second chamber 22 via feed line 38 and nozzle 39 and is allowed to flow through the slots 34 into first compartment 51. The flow rate of the inert gas may be controlled by a valve 37 in the feed line 38. The inert gas in the second chamber 22 flows over the workpiece(s) 11 whose internal passageway(s) are being coated and thereby prevents coating of external surfaces of the workpiece(s) 11. The inert gas exits out of the first compartment 51 through one or more holes 40 in one or more of the side walls 14. When the workpiece 11 is a turbine engine component, the inert gas flows over an airfoil 62 of the turbine engine component and passes a trailing edge 64 of the turbine engine component. This results in a reduction of coating vapor concentration/dwell at the surface of the airfoil portion of the turbine engine component, thus reducing, and ideally eliminating, coating deposition on external surfaces.

The second compartment 52 of the first chamber 20 contains a coating gas generator 42. An inert gas, such as argon, may be fed to the gas generator 42 via a feed line 44 which passes through an opening 46 in a side wall 14 of the coating vessel 12 and into the second compartment 52. A valve 45 may be provided to regulate the flow of the inert gas to the gas generator 42. The gas generator 42 may contain a source of coating material, such as an aluminum coating material source, e.g. a chromium-aluminum source, plus a halide activator, such as $AlF_3$, in amounts sufficient to generate a coating gas which deposits a desired coating on surfaces of the internal passages 50 of each workpiece 11. As shown in FIG. 3, the coating gas generated by the generator 42 may be supplied to the internal passages 50 of the workpieces 11 via tubing or feed lines 48 to cut surfaces 70 of the passages 50.

The gas generator 42 may be used to deposit an aluminide coating on surfaces of internal passages 50 of a turbine engine component. To do this, the gas generator 42 is supplied with an inert gas such as argon and contains an aluminum based material, such as a chromium-aluminum alloy material, and a halide activator, such as $AlF_3$.

By using a coating vessel arrangement such as that shown and described herein, the coating gas exits the workpiece 11 in any suitable manner into the first compartment 51. The exiting coating gas is forced to exit the vessel 12 without coming in contact with the external surfaces of the turbine component(s) 11 as a result of the flow of inert gas within the second chamber 22. The coating gas may exit the workpiece 11 in a variety of ways. For example, if the workpiece 11 is a turbine component, the coating gas may exit the component via cooling holes which are connected to the internal passageways. The flow of inert gas sweeps the exiting coating gas away from the turbine component and out the exit holes 40 of the vessel 12.

Typical temperatures used in the coating process can be up to 2050 degrees Fahrenheit. The pressure within the coating vessel 12 during the coating process may be atmospheric pressure, although increased and/or reduced pressures may also be utilized.

As an alternative, one can omit flowing an inert gas into the second chamber 22 and then causing the inert gas to flow over the external surfaces of the turbine engine component(s). Instead, one can create a venturi in the first chamber 20 to virtually suck the coating gas out of the coating vessel 12, thus preventing coating of the external surface of the turbine component(s) 11. This can be done by creating a high inert gas flow through first compartment 51 by introducing the inert gas at a side wall 14 and exiting at an opposing side wall 14 in a direction parallel to support 53.

There is no current technology in the vapor coatings industry which produces the coating configuration proposed here. All current vapor coating processes result in coating of the external surfaces when applying coating to the internal surfaces unless expensive, labor intensive masking is used and that does not always guarantee success. Other aluminizing techniques, such as slurry and pack powder processes, can successfully coat the internal passages of modern serpentine internal coating configurations which require a vapor process to achieve an acceptable internal coating distribution.

While the present method and apparatus have been described in the context of coating surfaces of internal passageways within a workpiece, such as a turbine engine component, with an aluminide material, it should be recognized that the apparatus may be used to coat surfaces of internal passageways within the workpiece with other types of coatings. It also should be recognized that the apparatus may be used to coat internal surfaces of a turbine engine component which do not form part of a cooling passageway.

While the coating vessel 12 may be rectangular in shape, it should be apparent to those skilled in the art that the coating vessel could have other polygonal shapes or could have a circular cross sectional shape.

It is apparent that there has been provided an apparatus and method for coating internal surfaces of a turbine engine component which fully satisfies the objects, means, and advantages set forth hereinbefore. While the present apparatus has been described in the context of specific embodiments thereof, other unforeseeable alternatives, modifications, and variations may become apparent to those skilled in the art having read the foregoing description. Accordingly, it is intended to embrace those alternatives, modifications, and variations as fall within the broad scope of the appended claims.

What is claimed is:

1. A coating apparatus comprising:
a vessel defining an internal space;
a plate dividing the internal space into a first chamber and a second chamber;
a divider supporting said plate and dividing said first chamber into a first compartment and a second compartment;
said first compartment having at least one hole for allowing an inert gas to flow out of said first chamber;
a generator for generating a coating gas, said generator being positioned within said second compartment; and
said plate having at least one cut-out for receiving a portion of a work-piece having at least one internal passage to be coated;
wherein each of said side walls has a shoulder portion and said plate is supported by said shoulder portion.

2. The coating apparatus according to claim 1, wherein said vessel is formed from a material to which a coating material used to coat surfaces of said at least one internal passage does not adhere.

3. The coating apparatus according to claim 2, wherein said material is graphite.

4. The coating apparatus according to claim 1, wherein said vessel has a plurality of side walls.

5. The coating apparatus according to claim 1, wherein said plate has at least one groove for receiving a root portion of the workpiece.

6. The coating apparatus according to claim 5, wherein each said groove is V-shaped.

7. The coating apparatus according to claim 5, further comprising means for feeding a flow of said inert gas into said second chamber so that said inert gas flows over external surfaces of said workpiece and each said groove in said plate allowing said inert gas to flow into said first compartment of said first chamber.

8. The coating apparatus according to claim 1, further comprising means for supplying said coating gas from said generator to said internal passages.

9. The coating apparatus according to claim 8, further comprising means for supplying an said inert gas to said coating gas generator.

10. The coating apparatus according to claim 9, wherein said generator contains a source of coating gas and a halide activator.

11. The coating apparatus according to claim 1, wherein said vessel is closed at a first end and open at a second end and has a removable cover for closing said open end of said vessel.

* * * * *